(12) United States Patent
Nakamura

(10) Patent No.: US 11,916,365 B2
(45) Date of Patent: Feb. 27, 2024

(54) WIRING SUBSTRATE

(71) Applicants: AutoNetworks Technologies, Ltd., Yokkaichi (JP); Sumitomo Wiring Systems, Ltd., Yokkaichi (JP); Sumitomo Electric Industries, Ltd., Osaka (JP)

(72) Inventor: Arinobu Nakamura, Yokkaichi (JP)

(73) Assignees: AutoNetworks Technologies, Ltd., Yokkaichi (JP); Sumitomo Wiring Systems, Ltd., Yokkaichi (JP); Sumitomo Electric Industries, Ltd., Osaka (JP)

(*) Notice: Subject to any disclaimer, the term of this patent is extended or adjusted under 35 U.S.C. 154(b) by 289 days.

(21) Appl. No.: 17/610,006

(22) PCT Filed: Apr. 22, 2020

(86) PCT No.: PCT/JP2020/017273
§ 371 (c)(1),
(2) Date: Nov. 9, 2021

(87) PCT Pub. No.: WO2020/230552
PCT Pub. Date: Nov. 19, 2020

(65) Prior Publication Data
US 2022/0224096 A1    Jul. 14, 2022

(30) Foreign Application Priority Data
May 13, 2019 (JP) ................. 2019-090685

(51) Int. Cl.
*H02G 3/16* (2006.01)
*H05K 7/06* (2006.01)
*H05K 1/02* (2006.01)

(52) U.S. Cl.
CPC ............ *H02G 3/16* (2013.01); *H05K 7/06* (2013.01); *H05K 1/0201* (2013.01)

(58) Field of Classification Search
CPC ........................................ H03G 3/16
(Continued)

(56) References Cited

U.S. PATENT DOCUMENTS

| 7,167,377 B2 | 1/2007 | Onizuka et al. |
| 2018/0027646 A1* | 1/2018 | Sumida ............ H05K 7/20854 361/720 |

(Continued)

FOREIGN PATENT DOCUMENTS

| JP | 2001-197627 A | 7/2001 |
| JP | 2016-220277 A | 12/2016 |
| JP | 2018-117473 A | 7/2018 |

OTHER PUBLICATIONS

International Search Report, Application No. PCT/JP2020/017273, dated Jul. 28, 2020. ISA/Japan Patent Office.

*Primary Examiner* — Stanley Tso
(74) *Attorney, Agent, or Firm* — Honigman LLP

(57) ABSTRACT

A wiring substrate includes a first conductive plate, a second conductive plate, and a first insulator. A first end of an element is connected to a first main surface of the first conductive plate, and a second end of the element is connected to a first main surface of the second conductive plate. The first insulator includes a first portion and a second portion. The first portion separates the first conductive plate and the second conductive plate from each other. The second portion is continuous with the first portion, and covers at least a portion of the first main surface. The first portion includes an end portion. The end portion protrudes from the (Continued)

second main surface to the opposite of the first main surface or from the second main surface to the opposite of the first main surface.

16 Claims, 4 Drawing Sheets

(58) Field of Classification Search
USPC .......................................................... 174/520
See application file for complete search history.

(56) References Cited

U.S. PATENT DOCUMENTS

2018/0368249 A1* 12/2018 Chin ...................... B60R 16/02
2020/0051911 A1* 2/2020 Nakamura ........ H01L 21/76802

* cited by examiner

WIRING SUBSTRATE

CROSS-REFERENCE TO RELATED APPLICATIONS

This application is the U.S. national stage of PCT/JP2020/017273 filed on Apr. 22, 2020, which claims priority of Japanese Patent Application No. JP 2019-090685 filed on May 13, 2019, the contents of which are incorporated herein.

TECHNICAL FIELD

The present disclosure relates to a wiring substrate.

BACKGROUND

Circuit substrates that include a plate that is conductive and is called a "busbar" (in the present disclosure, referred to as "conductive plate") are known.

JP 2003-164039A discloses a method for detaching, in a busbar construct that has a shape in which busbars are connected to each other, the busbars from each other.

JP 2016-220277A discloses a pair of busbars for mounting a power semiconductor, and an FPC (Flexible Printed Circuit) that intervenes in the transmission of a control signal for controlling the power semiconductor.

In JP 2003-164039A, detaching the busbars from the busbar construct realizes insulation of the detached busbars from each other. In JP 2016-220277A, an FPC is adhered to the pair of busbars.

The present disclosure aims to increase the effect of insulating busbars from each other.

SUMMARY

A wiring substrate according to the present disclosure includes an element mounted thereon, the element including a first end and a second end, and functions as a path for a current flowing between the first end and the second end to flow outside of the element. The wiring substrate includes a first conductive plate, a second conductive plate, and a first insulator.

The first conductive plate includes a first main surface on which the element is mounted, and that is connected to the first end, and a second main surface whose position is different from a position of the first main surface of the first conductive plate in a thickness direction of the first conductive plate.

The second conductive plate includes a first main surface on which the element is mounted, and that is connected to the second end, and a second main surface whose position is different from a position of the first main surface of the second conductive plate in a thickness direction of the second conductive plate.

The first insulator includes a first portion that separates the first conductive plate and the second conductive plate from each other, and a second portion that is continuous with the first portion, and covers at least a portion of the first main surface of the first conductive plate.

The first portion includes an end portion that protrudes from the second main surface of the first conductive plate to the opposite side of the first main surface of the first conductive plate or from the second main surface of the second conductive plate to the opposite side of the first main surface of the second conductive plate.

Advantageous Effects of Invention

According to the present disclosure, the effect of insulating a first conductive plate and a second conductive plate from each other is increased.

DETAILED DESCRIPTION OF PREFERRED EMBODIMENTS

Figure 1:
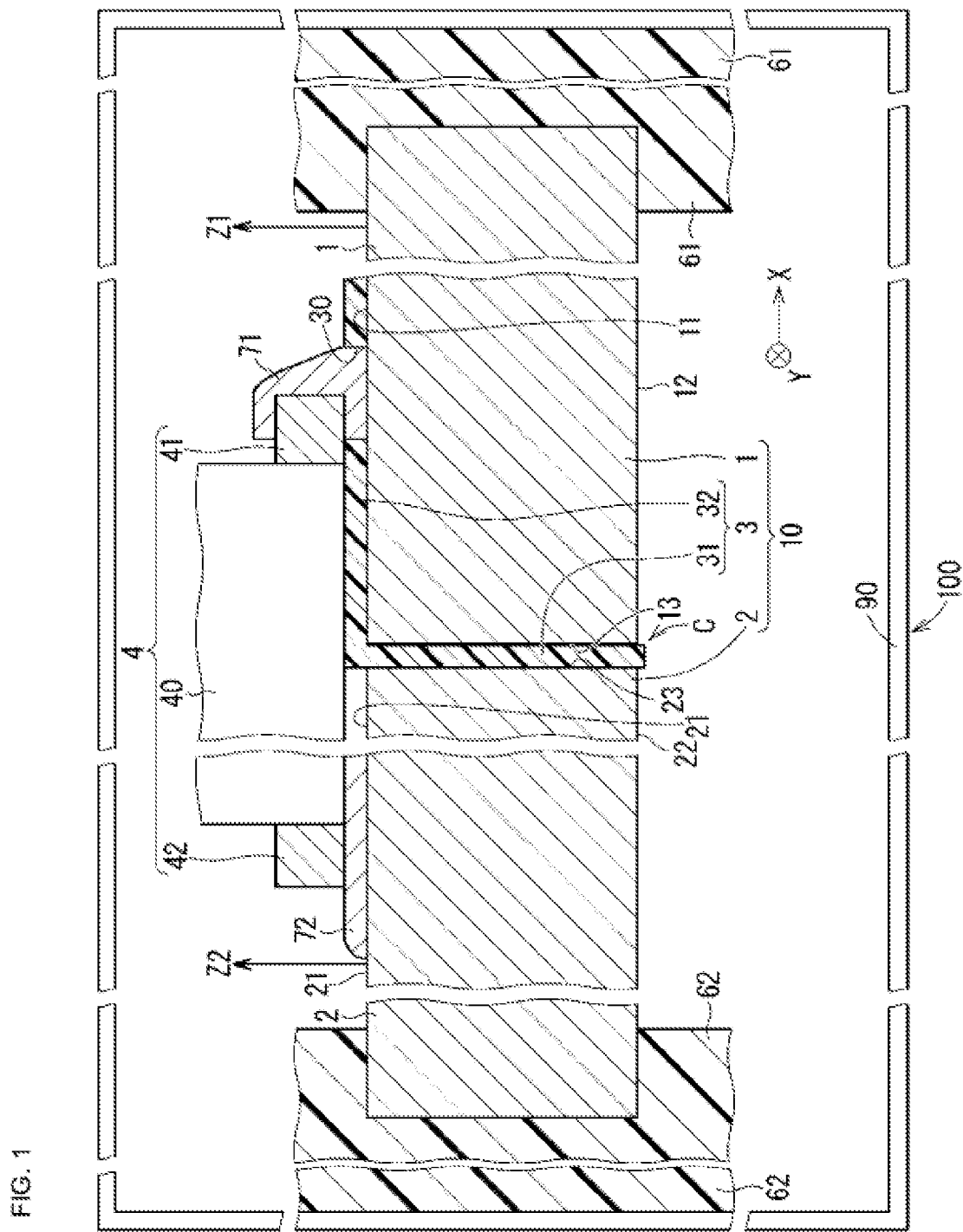
FIG. 1 is a cross-sectional view showing an example of the configuration of an electrical junction box according to first and second embodiments.

First, embodiments of the present disclosure will be listed and described.

A wiring substrate according to the present disclosure includes an element mounted thereon, the element including a first end and a second end, and functions as a path for a current flowing between the first end and the second end to flow outside of the element. The wiring substrate includes a first conductive plate, a second conductive plate, and a first insulator.

The first conductive plate includes a first main surface on which the element is mounted, and that is connected to the first end, and a second main surface whose position is different from a position of the first main surface of the first conductive plate in a thickness direction of the first conductive plate.

The second conductive plate includes a first main surface on which the element is mounted, and that is connected to the second end, and a second main surface whose position is different from a position of the first main surface of the second conductive plate in a thickness direction of the second conductive plate.

The first insulator includes a first portion that separates the first conductive plate and the second conductive plate from each other, and a second portion that is continuous with the first portion, and covers at least a portion of the first main surface of the first conductive plate.

The first portion includes an end portion that protrudes from the second main surface of the first conductive plate to the opposite side of the first main surface of the first conductive plate or from the second main surface of the second conductive plate to the opposite side of the first main surface of the second conductive plate.

According to the present disclosure, the first conductive plate and the second conductive plate are separated from each other by the first portion, and are insulated from each other. The second portion increases the insulation distance between the first conductive plate and the second conductive plate, and thus the effect of insulating the first conductive plate from the second conductive plate is increased.

The second portion preferably includes a hole for exposing the first main surface of the first conductive plate. Such a configuration makes it easy to electrically connect the first end of the element to the first main surface of the first conductive plate.

It is preferable that the wiring substrate further includes a current-carrying portion, wherein the current-carrying portion is covered by the second portion of the first insulator, or opposes the first main surface of the first conductive plate via the second portion, and the element further includes a third end that is connected to the current-carrying portion. In such a configuration, the third end is supplied with a potential that does not depend on the potential of the first conductive plate and the potential of the second conductive plate.

It is preferable that the end portion of the first portion at least partially covers at least one of the second main surface of the first conductive plate and the second main surface of the second conductive plate. Such a configuration increases the insulation distance between the first conductive plate and the second conductive plate, and thus the effect of insulating the first conductive plate from the second conductive plate is increased.

The wiring substrate further includes a second insulator, on at least one of the second main surface of the first conductive plate and the second main surface of the second conductive plate, the second insulator preferably holding the end portion of the first portion. With such a configuration, the second portion is unlikely to be separated from the first main surface.

The first insulator is preferably shaped like a sheet. Even when the first conductor and the second conductor generate heat as a result of a current flowing through the first conductor and the second conductor, the influence of thermal expansion of the first portion caused by the generated heat is small due to the first portion being thin. This is advantageous in terms of reducing stress that acts on the connection between the first end and the first main surface of the first conductive plate and the connection between the second end and the first main surface of the second conductive plate.

Specific examples of a wiring substrate of the present disclosure will be described below with reference to the drawings. Note that the present disclosure is not limited to illustrations of these, but is indicated by the claims, and all changes that come within the meaning and range of equivalency of the claims are intended to be embraced therein.

First Embodiment

A wiring substrate according to a first embodiment will be described below. In the first embodiment, an electrical junction box 100 that includes a wiring substrate 10 will be described as an example.

Figure 2:
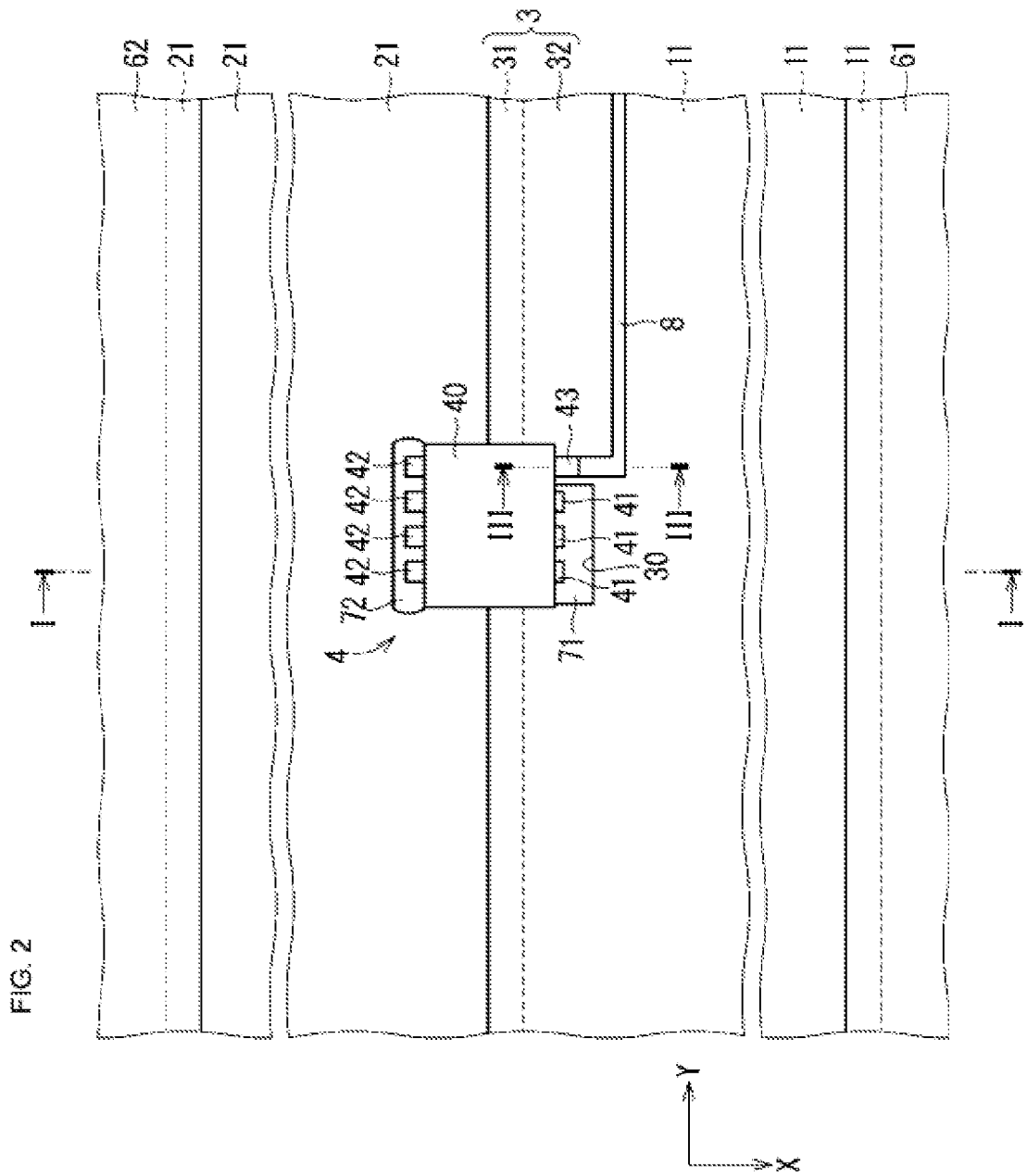
FIG. 2 is a plan view showing an example of a wiring substrate according to the first and second embodiments and the surroundings thereof.

FIG. 1 is a cross-sectional view showing an example of the wiring substrate 10 according to the first embodiment and the surroundings thereof. FIG. 2 is a plan view showing an example of the wiring substrate 10 according to the embodiments of the present invention and the surroundings thereof. FIG. 1 is a cross-sectional view taken along the position I-I in FIG. 2 as viewed along the arrow direction.

The electrical junction box 100 includes an element 4, the wiring substrate 10, holding portions 61 and 62, and a case 90. In FIG. 2, the case 90 is omitted.

The element 4 is mounted on the wiring substrate 10. The wiring substrate 10 functions as a path for a current flowing between a first end 41 and a second end 42 within the element 4 to flow outside the element 4.

The element 4 includes the first end 41 and the second end 42. A semiconductor switching element illustrated as a field effect transistor (hereinafter referred to as "FET"), for example, is used as the element 4, depending on the intended use the electrical junction box 100. Alternatively, the element 4 may be a resistor, a coil, or a capacitor.

A case will be described below in which the element 4 is an FET, as an example. One of the first end 41 and the second end 42 functions as a source electrode, and the other functions as a drain electrode. A case will be described below in which the first end 41 is a source electrode and the other end is a drain electrode, as an example. In the first embodiment, a case is illustrated in which the FET 4 is a surface mount power MOSFET. The source electrode 41 and the drain electrode 42 are positioned outside a main body 40 of the FET 4.

The wiring substrate 10 includes a first conductive plate 1, a second conductive plate 2, and a first insulator 3.

The first conductive plate 1 includes a first main surface 11 and a second main surface 12. The first main surface 11 has the FET 4 mounted thereon and is connected to the source electrode 41. The second main surface 12 is a surface on the opposite side of the first main surface 11. The position of the second main surface 12 is different from the position of the first main surface 11 in a direction Z1, which is the thickness direction of the first conductive plate 1. The first conductive plate 1 has a rectangular plate shape, for example. The first conductive plate 1 is a busbar on the source electrode side (hereinafter referred to as "source busbar"). Metal is used as the material of a source busbar 1, for example.

The second conductive plate 2 includes a first main surface 21 and a second main surface 22. The first main surface 21 has the FET 4 mounted thereon and is connected to the drain electrode 42. The second main surface 22 is a surface on the opposite side of the first main surface 21. The position of the second main surface 22 is different from the position of the first main surface 21 in a direction Z2, which is the thickness direction of the second conductive plate 2. The second conductive plate 2 has a rectangular plate shape, for example. The second conductive plate 2 is a busbar on the drain electrode side (hereinafter referred to as "drain busbar"). Metal is used as the material of a drain busbar 2, for example.

The FET 4 is mounted on both of the first main surfaces 11 and 21, and thus the first main surface 11 is positioned closer to the FET 4 than the second main surface 12 is, and the first main surface 21 is positioned closer to the FET 4 than the second main surface 22 is.

For convenience of description, a configuration will be described in which one FET 4 is mounted on the wiring substrate 10. A plurality of FETs 4 may also be mounted on the wiring substrate 10. In addition to the FET 4, a semiconductor element illustrated as a zener diode may also be implemented on the source busbar 1 and the drain busbar 2.

In the first embodiment, the directions Z1 and Z2 are not necessarily limited to being parallel with each other. A case will be described below in which the direction Z1 and Z2 are parallel with each other, as an example.

Directions X and Y are not parallel with the direction Z1 and Z2, but are orthogonal to the direction Z1 and Z2, for example. The direction Y is not parallel with the direction X, but is orthogonal to the direction X, for example. In the first embodiment, the source busbar 1 and the drain busbar 2 oppose each other along the direction X. An end surface 13 of the source busbar 1 opposes the drain busbar 2. An end surface 23 of the drain busbar 2 opposes the source busbar 1.

To be more specific, the main body 40 of the FET 4 is disposed spanning the position at which the source busbar 1 and the drain busbar 2 oppose each other. To be more specific, the main body 40 of the FET 4 is disposed spanning the end surfaces 13 and 23. The source electrode 41 is positioned on the direction X side as viewed from the drain electrode 42.

The source electrode 41 is positioned on the direction Z1 side relative to the source busbar 1, and the drain electrode 42 is positioned on the direction Z2 side relative to the drain busbar 2. The source electrode 41 is connected to the first main surface 11 of the source busbar 1 using solder 71. The drain electrode 42 is connected to the first main surface 21 of the drain busbar 2 using solder 72.

The first insulator 3 includes a first portion 31 and a second portion 32. The first portion 31 separates the source busbar 1 and the drain busbar 2, more specifically, the end surface 13 and the end surface 23. The first portion 31 is in contact with one of or both the end surface 13 and the end surface 23, for example.

The first portion 31 includes an end portion C. The end portion C protrudes from the second main surface 12 to the opposite side of the first main surface 11. Alternatively, the end portion C protrudes from the second main surface 22 to the opposite side of the first main surface 21. In the first embodiment, a case is illustrated in which the end portion C protrudes from both of the second main surfaces 12 and 22.

The second portion 32 is continuous with the first portion 31, and covers a portion of the first main surface 21. The first insulator 3 that includes the above-described first portion 31 and second portion 32 increases the distance of insulation between the source busbar 1 and the drain busbar 2. The insulation distance being longer improves the effect of insulating insulative busbars from each other.

Position at which Element 4 is Disposed

As a result of the FET 4 being disposed spanning the first main surfaces 11 and 21, the source electrode 41 is aligned with the first main surface 11 in the direction Z1, and the drain electrode 42 is aligned with the first main surface 21 in the direction Z2. It is easy to electrically connect the source electrode 41 to the first main surface 11 using the solder 71, and to electrically connect the drain electrode 42 to the first main surface 21.

If the drain electrode 42, in addition to the source electrode 41, is aligned with the first main surface 21 along the direction Z2, in order to connect the source electrode 41 to the first main surface 11, a current-carrying portion that is insulated from the first main surface 21 needs to be disposed spanning the first portion 31 along the direction X. If the source electrode 41, in addition to the drain electrode 42, is aligned with the first main surface 11 along the direction Z1, in order to connect the drain electrode 42 to the first main surface 21, a current-carrying portion that is insulated from the first main surface 11 needs to be disposed spanning the first portion 31 along the direction X. The cross-sectional area of such a current-carrying portion is small compared with the source busbar 1 and the drain busbar 2, and thus is likely to generate heat. Therefore, in terms of avoiding generating heat, it is advantageous to avoid disposing such a current-carrying portion.

A current flows through the FET 4, and it accordingly flows through the source busbar 1 and the drain busbar 2, and the source busbar 1 and the drain busbar 2 thermally expand. When this current stops flowing, the source busbar 1 and the drain busbar 2 contract.

When such expansion or contraction occurs, stress that acts along the direction X acts on the solder 71 and the solder 72. The further the solder 71 and the solder 72 are separated, the larger this stress is. In terms of electrical connection realized by the solder 71 and the solder 72, it is advantageous that this stress is reduced. Therefore, it is advantageous that the position at which the source electrode 41 is connected to the source busbar 1 by the solder 71 and the position at which the drain electrode 42 is connected to the drain busbar 2 by the solder 72 are close to each other.

Therefore, it is desirable that the FET 4 is disposed spanning the first main surfaces 11 and 21, the source electrode 41 is aligned with the first main surface 11 along the direction Z1, and the drain electrode 42 is aligned with the first main surface 21 along the direction Z2.

Illustration of First Insulator 3

As a result of a current flowing through the source busbar 1 and the drain busbar 2, the source busbar 1 and the drain busbar 2 generate heat. The first portion 31 being thinner is advantageous in terms of the influence of thermal expansion of the first portion 31 caused by generated heat being small. This is because stress that acts on the solder 71 and the solder 72 along the direction X is reduced. For this reason a sheet-like resin film is used as the first insulator 3, for example.

Polyimide is used as the material of the resin film, for example. Polyimide is highly insulative, and its thermal expansion coefficient is close to that of metal. Therefore, using polyimide as the material of the resin film is advantageous in terms of mitigating the above stress caused by heat generated by the source busbar 1 and the drain busbar 2.

The resin film made of polyimide is highly flexible. Such high flexibility is advantageous in terms of facilitating a process of disposing the first portion 31 of the first insulator 3 between the end surfaces 13 and 23.

Relationship Between Source Busbar 1, Drain Busbar 2, and Case 90

On the opposite side of the drain busbar 2, the source busbar 1 is fixed to the case 90 via the holding portion 61. On the opposite side of the source busbar 1, the drain busbar 2 is fixed to the case 90 via the holding portion 62. The holding portions 61 and 62 are manufactured through insert molding using an insulative resin material such as polybutylene terephtalate resin (hereinafter, also referred to as "PBT resin") or polyphenylene sulfide resin (hereinafter, also referred to as "PPS resin"), for example. The holding portions 61 and 62 may also be formed in one piece with the case 90, for example.

The second portion 32 includes a hole 30 for exposing the first main surface 11. In the first embodiment, at the position at which the first main surface 11 is exposed through the hole 30, a portion of the first main surface 11 and a portion of the source electrode 41 are aligned along the direction Z1. The source electrode 41 and the first main surface 11 are electrically connected via the hole 30 using solder 7. The hole 30 facilitates electrical connection between the source electrode 41 and the source busbar 1.

Second Embodiment

A wiring substrate according to a second embodiment will be described. Also in the second embodiment, similarly to the first embodiment, an electrical junction box 100 that includes the wiring substrate 10 will be described as an example.

Figure 3:
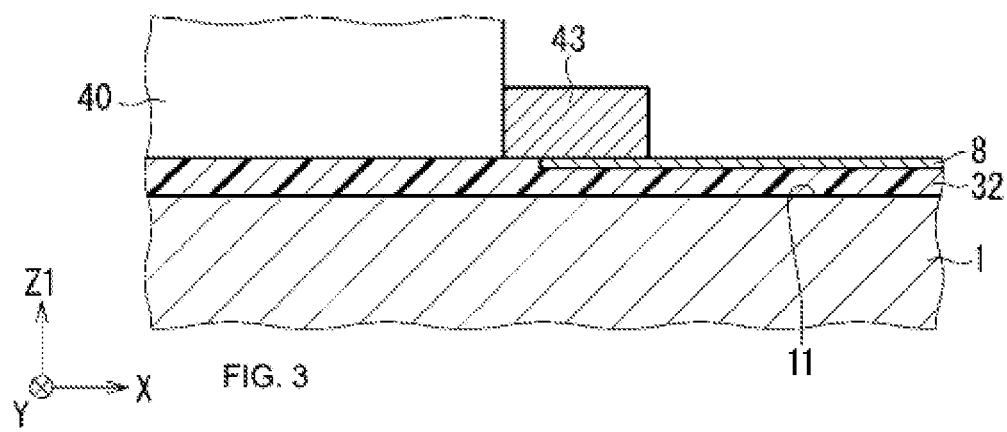
FIG. 3 is a cross-sectional view showing an example of a portion of the wiring substrate according to the second embodiment.

FIG. 1 is a cross-sectional view showing an example of the wiring substrate 10 according to the second embodiment and the surroundings thereof. FIG. 2 is a plan view showing an example of the wiring substrate 10 according to the second embodiment and the surroundings thereof. FIG. 1 is a cross-sectional view taken along the position I-I in FIG. 2 as viewed along the arrow direction. FIG. 3 is a cross-sectional view taken along the position III-III in FIG. 2 as viewed along the arrow direction. In FIGS. 2 and 3, the case 90 is omitted.

Note that, in the description of the second embodiment, constituent elements similar to those described in the first embodiment are given the same reference numerals, and a description thereof is omitted.

The element 4 includes a third end 43. In the second embodiment, the third end 43 is positioned on the direction X side relative to the main body 40, and is positioned on the direction Z1 side relative to the first main surface 11. The third end 43 is farther from the first main surface 21 than the main body 40 is along the direction X, and is farther from the second main surface 12 than the first main surface 11 is along the direction Z1.

The third end 43 has, for example, a function of receiving, from outside of the main body 40, a signal for controlling a current flowing between the first ends 41 and the second ends 42 within the main body 40. In this embodiment, a case is illustrated in which the FET 4 includes a gate electrode 43.

The gate electrode 43 is connected to a current-carrying portion 8. The current-carrying portion 8 opposes the first main surface 11 via the second portion 32. The current-carrying portion 8 is made of a copper foil, for example. The gate electrode 43 is electrically connected to the current-carrying portion 8 through soldering connection, for example.

The current-carrying portion 8 is insulated from the first main surface 11 by the second portion 32, and the gate electrode 43 is supplied with a potential that does not depend on the potential of the source busbar 1 and the potential of the drain busbar 2.

In the second embodiment, the current-carrying portion 8 is adhered to the second portion 32 on the opposite side of the first main surface 11. The second portion 32 is made of a sheet-like resin, for example. The current-carrying portion 8 may also be covered by the second portion 32. A configuration may also be adopted in which the current-carrying portion 8 is embedded in the second portion 32, and, in the vicinity of the gate electrode 43, is exposed from the second portion 32 to the opposite side of the first main surface 11, for example.

The above-described current-carrying portion 8 and second portion 32 are realized by an FPC, for example. Realizing the current-carrying portion 8 and the second portion 32 using an FPC is advantageous in terms of simplifying the manufacturing process The second portion 32 may also be partially fixed to the source busbar 1 or the holding portion 61. In this case, the second portion 32 can deform to a certain degree along the direction X.

A current flows through the FET 4, and it accordingly flows through the source busbar 1 and the drain busbar 2, and the source busbar 1 and the drain busbar 2 thermally expand. When this current stops flowing, the source busbar 1 and the drain busbar 2 contract. The second portion 32 can deform in accordance with such expansion or contraction.

Third Embodiment

A wiring substrate according to a third embodiment will be described. In the third embodiment, the configuration of the end portion C described in the first and second embodiments and the vicinity thereof will be described.

Figure 4:
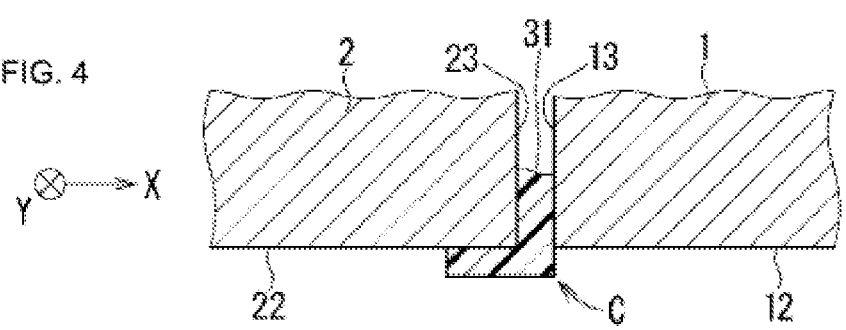
FIG. 4 is a cross-sectional view showing a first example of a portion of a wiring substrate according to a third embodiment.

FIG. 4 is a cross-sectional view showing a first example of a portion of the wiring substrate according to the third embodiment, as viewed along the direction Y. The end portion C at least partly covers the second main surface 22. The first portion 31 is continuous from between the end surfaces 13 and 23 to at least a portion of the second main surface 22.

Figure 5:
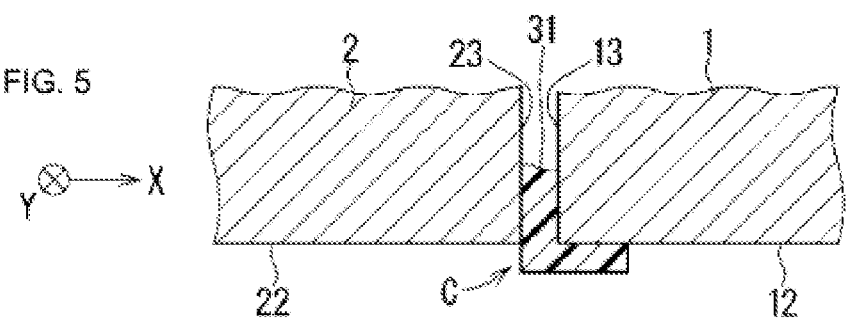
FIG. 5 is a cross-sectional view showing a second example of a portion of the wiring substrate according to the third embodiment.

FIG. 5 is a cross-sectional view showing a second example of a portion of the wiring substrate according to the third embodiment, as viewed along the direction Y. The end portion C at least partly covers the second main surface 12. The first portion 31 is continuous from between the end surfaces 13 and 23 to at least a portion of the second main surface 12.

In both the above-described first and second examples, the insulation distance is increased, and the effect of insulating the source busbar 1 from the drain busbar 2 is increased.

Fourth Embodiment

A wiring substrate according to a fourth embodiment will be described. In the fourth embodiment, the configuration of the end portion C described in the first and second embodiments and the vicinity thereof will be described.

Figure 6:
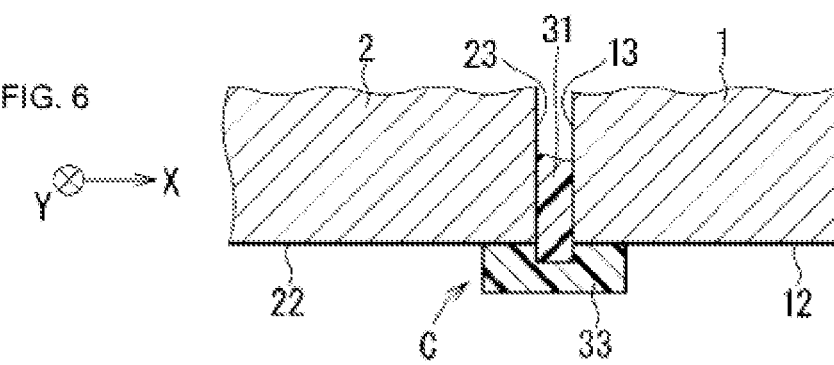
FIG. 6 is a cross-sectional view showing an example of a portion of a wiring substrate according to a fourth embodiment.

FIG. 6 is a cross-sectional view showing an example of a portion of the wiring substrate according to the fourth embodiment, as viewed along the direction Y. The wiring substrate 10 further includes a second insulator 33.

The second insulator 33 holds the end portion C, on at least one of the second main surfaces 12 and 22. In FIG. 6, the second insulator 33 holds the end portion C on both the second main surfaces 12 and 22. The end portion C is surrounded by the second insulator 33, for example.

The end portion C is held by the second insulator 33, and thus the first portion 31 is unlikely to come loose from a gap formed by the end surfaces 13 and 23. Therefore, the second portion 32 is unlikely to be separate from the first main surface 11. Providing the second insulator 33 is advantageous in terms of preventing the first insulator 3 from moving.

In addition, increasing the distance of insulation in the vicinity of the end portion C is also advantageous in terms of increasing the effect of insulating the source busbar 1 and the drain busbar 2 from each other.

An insulative resin material such as a PBT resin, a PPS resin, or the like is used for the second insulator 33. The second insulator 33 is not disposed between the end surfaces 13 and 23. Therefore, the second insulator 33 is fixed to both the second main surfaces 12 and 22, and even when heat generated as a result of a current flowing through the source busbar 1 and the drain busbar 2 causes the second insulator 33 to expand, stress that acts on the solder 71 and the solder 72 along the direction X is small.

SUPPLEMENTARY NOTE

In any embodiment of the present disclosure, the first end 41 of the element 4 may be used as the drain electrode of the FET, and the second end 42 may be used as the source electrode of the FET. In this case, the first conductive plate 1 functions as a drain busbar, and the second conductive plate 2 functions as a source busbar.

In any embodiment of the present disclosure, the first portion 31 may be fixed to one of the end surface 13 and the end surface 23. Adhesion is adopted for such fixing, for example.

Note that the configurations described in the above embodiments and modifications may be suitably combined as long as there is no mutual contradiction.

The invention claimed is:

1. A wiring substrate that includes an element mounted thereon, the element including a first end and a second end, and that functions as a path for a current flowing between the first end and the second end to flow outside of the element, the wiring substrate comprising:
    a first conductive plate, a second conductive plate, and a first insulator,
    wherein the first conductive plate includes:
        a first main surface on which the element is mounted, and that is connected to the first end, and
        a second main surface whose position is different from a position of the first main surface of the first conductive plate in a thickness direction of the first conductive plate,
    the second conductive plate includes:
        a first main surface on which the element is mounted, and that is connected to the second end, and
        a second main surface whose position is different from a position of the first main surface of the second conductive plate in a thickness direction of the second conductive plate,
    the first insulator includes:
        a first portion that separates the first conductive plate and the second conductive plate from each other, and
        a second portion that is continuous with the first portion, and covers at least a portion of the first main surface of the first conductive plate, and
    the first portion includes an end portion that protrudes from the second main surface of the first conductive plate to the opposite side of the first main surface of the first conductive plate or from the second main surface of the second conductive plate to the opposite side of the first main surface of the second conductive plate.

2. The wiring substrate according to claim 1, wherein the second portion includes a hole for exposing the first main surface of the first conductive plate.

3. The wiring substrate according to claim 2, further comprising:
    a current-carrying portion,
    wherein the current-carrying portion is covered by the second portion of the first insulator, or opposes the first main surface of the first conductive plate via the second portion, and
    the element further includes a third end that is connected to the current-carrying portion.

4. The wiring substrate according to claim 2, wherein the end portion of the first portion at least partially covers at least one of the second main surface of the first conductive plate and the second main surface of the second conductive plate.

5. The wiring substrate according to claim 2, further comprising:
    a second insulator,
    wherein, on at least one of the second main surface of the first conductive plate and the second main surface of the second conductive plate, the second insulator holds the end portion of the first portion.

6. The wiring substrate according to claim 2, wherein the first insulator is shaped like a sheet.

7. The wiring substrate according to claim 1, further comprising:
    a current-carrying portion,
    wherein the current-carrying portion is covered by the second portion of the first insulator, or opposes the first main surface of the first conductive plate via the second portion, and
    the element further includes a third end that is connected to the current-carrying portion.

8. The wiring substrate according to claim 7, wherein the end portion of the first portion at least partially covers at least one of the second main surface of the first conductive plate and the second main surface of the second conductive plate.

9. The wiring substrate according to claim 7, further comprising:
    a second insulator,
    wherein, on at least one of the second main surface of the first conductive plate and the second main surface of the second conductive plate, the second insulator holds the end portion of the first portion.

10. The wiring substrate according to claim 7, wherein the first insulator is shaped like a sheet.

11. The wiring substrate according to claim 1, wherein the end portion of the first portion at least partially covers at least one of the second main surface of the first conductive plate and the second main surface of the second conductive plate.

12. The wiring substrate according to claim 11, further comprising:
    a second insulator,
    wherein, on at least one of the second main surface of the first conductive plate and the second main surface of the second conductive plate, the second insulator holds the end portion of the first portion.

13. The wiring substrate according to claim 1, further comprising:
    a second insulator,
    wherein, on at least one of the second main surface of the first conductive plate and the second main surface of the second conductive plate, the second insulator holds the end portion of the first portion.

14. The wiring substrate according to claim 11, wherein the first insulator is shaped like a sheet.

15. The wiring substrate according to claim 13, wherein the first insulator is shaped like a sheet.

16. The wiring substrate according to claim 1, wherein the first insulator is shaped like a sheet.

* * * * *